United States Patent [19]

Brunner et al.

[11] Patent Number: 5,045,783

[45] Date of Patent: Sep. 3, 1991

[54] METHOD FOR TESTING A PRINTED CIRCUIT BOARD WITH A PARTICLE PROBE

[75] Inventors: Matthias Brunner, Kirchheim; Hermann Wessely, Munich, both of Fed. Rep. of Germany

[73] Assignee: Siemens Aktiengesellschaft, Munich, Fed. Rep. of Germany

[21] Appl. No.: 524,850

[22] Filed: May 18, 1990

[30] Foreign Application Priority Data

Jun. 13, 1989 [EP] European Pat. Off. ........ 89110728-6

[51] Int. Cl.$^5$ ...................... G01R 31/00; G01R 31/02
[52] U.S. Cl. ............................... 324/158 R; 324/501; 324/538
[58] Field of Search ................ 324/158 R, 73.1, 501, 324/537, 538; 250/310, 311

[56] References Cited

U.S. PATENT DOCUMENTS

| | | | |
|---|---|---|---|
| 4,417,203 | 11/1983 | Pfeiffer et al. | 324/158 R |
| 4,841,242 | 6/1989 | Brunner | 324/158 R |
| 4,843,330 | 6/1989 | Golladay et al. | 324/158 R |
| 4,868,492 | 9/1989 | Beha et al. | 324/158 R |

OTHER PUBLICATIONS

Brunner et al; "A Dynamic . . . "; Scanning Electron Microscopy; 1985; III; pp. 991-999.
Brunner et al; "Bare-Board . . . "; Microelectronic Engineering; vol. 8; 1988; pp. 25-35.
Pfeiffer et al; "Contactless Electrical . . . "; J. Vac. Sci. Technol.; vol. 19, No. 4; 1981; pp. 1014-1017.

Primary Examiner—Ernest F. Karlsen
Attorney, Agent, or Firm—Hill, Van Santen, Steadman & Simpson

[57] ABSTRACT

Modified scanning electron microscopes are usually employed for the implementation of methods for testing the electrical properties of printed circuit boards with the electron probe. As a consequence of the deflection, chromatic aberration and of the aberrations of the objective lens increasing greatly with the deflection angle, however, their scanning field is limited. In order to be able to test larger printed circuit boards without involved improvement of electron optics, it is proposed that the printed circuit board be subdivided into a plurality of adjoining regions, whereby the size of the regions respectively approximately corresponds to the size of the scanning field. Each of the networks lying only within one of the regions is then tested in a known manner. In order to detect shorts between networks of different regions as well as interruptions between contact points of networks extending beyond regions, the known testing method is followed by a further test cycle.

11 Claims, 1 Drawing Sheet

METHOD FOR TESTING A PRINTED CIRCUIT BOARD WITH A PARTICLE PROBE

BACKGROUND OF THE INVENTION

1. Field of the Invention

The present invention relates to a method for testing a printed circuit board which comprises a plurality of networks composed of contact points and interconnects.

2. Description of the Prior Art

Electron beam measuring methods for testing the electrical properties of printed circuit boards and of miniaturized connecting modules are known from the publication Scanning Electron Microscopy, Vol. III, 1985, pp. 991-999, from the publication Microelectronics Engineering, Vol. 8, 1988, pp. reference. Modified scanning electron microscopes are usually employed for the implementation of these methods. Due to the deflection chromatic aberration and the aberrations of the objective lens that increase greatly with the deflection angle, their scanning fields, however, are limited, so that only printed circuit boards having a maximum size of approximately 10 cm × 10 cm can be presently checked (Probe Diameter $d \leq 30$ μm). Efforts to enlarge the scanning field by improving the electron optics led to the development of low-error or low-aberration objective lenses having integrated deflection systems (see, for example, J. Vac. Sci. Techn., Vol. 19, No. 4, 1981, pp. 1014, 1018). The further development thereof, however, involves a high technological and financial expenditure.

SUMMARY OF THE INVENTION

The object of the present invention is to provide a method of the type generally set forth above that allows even arbitrarily-large printed circuit boards to be tested, without involved improvement of the optics that generate the particle probe.

The above object is achieved in a method for testing a printed circuit board with a particle probe, whereby the printed circuit board comprises a plurality of networks composed of contact points and interconnects, the method being particularly characterized in that the printed circuit board is subdivided into a plurality of adjoining regions, the contact points lying outside of the first region are charged, the charge states of the contact points lying within the first region is interrogated with the assistance of the particle probe, and the respective measured charge state is compared to the charge state anticipated on the basis of network geometry.

The object is also achieved in a method for testing a printed circuit board with a particle probe, whereby a printed circuit board comprises a plurality of networks composed of contact points and interconnects, the method being particularly characterized in that the printed circuit board is subdivided into a plurality of adjoining regions, all contact points of the printed circuit board to be tested are charged, the contact points lying outside a first region are discharged, the charge states of the contact points lying within the first region are interrogated within the assistance of the particle probe, and the respective measured charge states are compared to the charge states anticipated on the basis of the network geometry.

The advantage which may be obtained in practicing the present invention is that, in particular, even large printed circuit boards can be tested in electron beam measuring instruments having a relatively small scanning field.

According to a feature of the invention, in the first-mentioned method, the charging of the contact points lying outside of a first region, the interrogation of the charge states of the contact points lying within the first region and the comparison of the measured charge states to anticipated charge states are carried out for each of the other regions in a corresponding manner, whereby the printed circuit board is discharged before implementation of each of the charge steps.

According to another feature of the invention, the first-method is also particularly characterized by a modification thereof in which only the contact points lying within a second region are charged.

According to another feature of the invention, the second-mentioned method is particularly characterized in that each of the steps thereof is implemented for each of the other regions in a corresponding manner.

According to another feature of the invention, the method is particularly characterized in that the size of the regions is selected to approximately correspond to the size of the scanning regions of the particle probe.

According to another feature of the invention, the method is particularly characterized in that the contact points are charged with the particle probe.

According to another feature of the invention, the method is particularly characterized in that the contact points are charged or discharged by a planar irradiation of the respective regions with a particle beam.

According to another feature of the invention, the method is particularly characterized in that the regions are brought into congruency with the scanning region by displacing the printed circuit board or displacing a particle optics that generates the particle probe.

BRIEF DESCRIPTION OF THE DRAWING

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
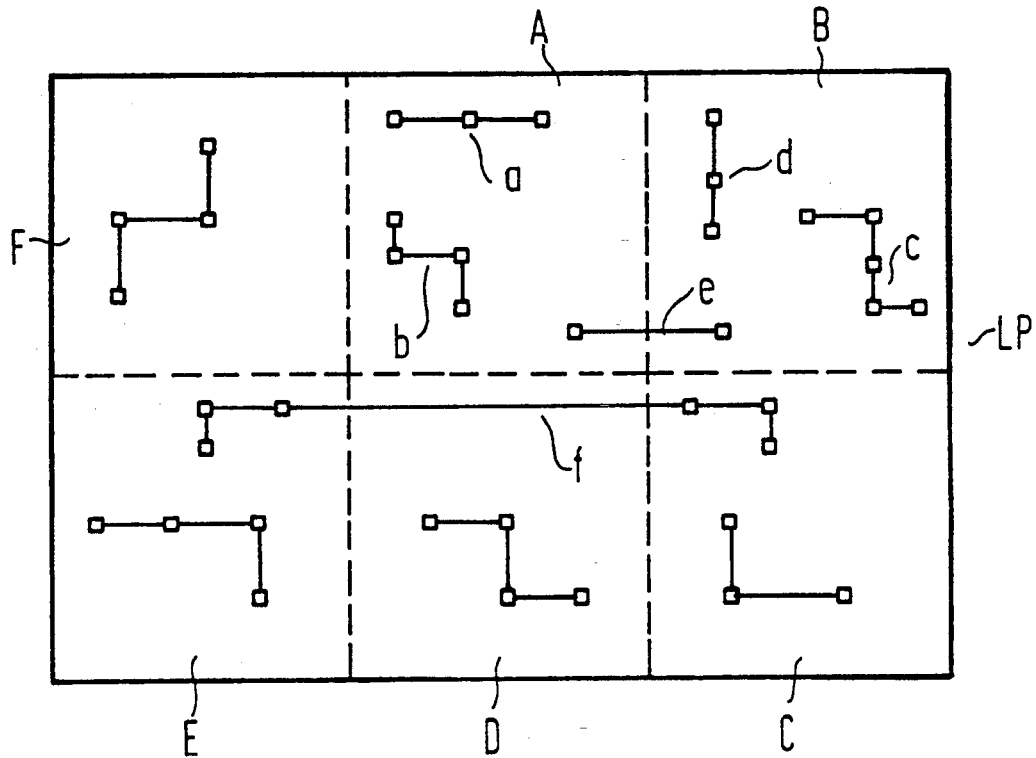
FIG. 1 is a schematic representation of a plan view of a printed circuit board having a plurality of networks composed of contact points and interconnects.

FIG. 1 illustrates a printed circuit board LP having a plurality of networks composed of a multitude of contact points (pads) and interconnects whose electrical properties are to be tested in, for example, an electron beam measuring instrument, such as disclosed in the European application 0 189 777. Since the electron probe, due to the aberrations of the objective lens and of the deflection unit can only be reliably positioned to the contact points lying in the close proximity of the optical axis, the printed circuit board LP is subdivided into a plurality of adjoining regions A-F whose size respectively approximately correspond to the size of the maximum scanning field for a given probe diameter of $d \leq 50$ μm. For checking the networks for shorts and opens, one of the regions (for example the one of the regions (for example the region A) is brought into congruency with the scanning field characteristic for the objective lens by mechanical displacement of the printed circuit board LP or of the electron optics. Subsequently, one of the contact points of a network (for example the contact point a) lying within the region A is charged and a test is carried out to see whether the other contact points belonging to the same network are likewise charged. When this is not the case, an open must be present. A short is detected in that the contact points of the other networks (for example contact points of the network b) are also charged when the network a is charged. After the implementation of the corresponding measurement at the networks (for example, the network b) likewise lying only within the region A, the printed circuit board LP is displaced in order to bring another region (for example the region B) into congruency with the scanning field and to test the networks thereof in the described manner. The same is repeated at all other regions C-F, whereby the printed circuit board LP is respectively discharged before the beginning of each test cycle, for example by irradiation with ions, low-energy electrons or photons.

Figure 2:
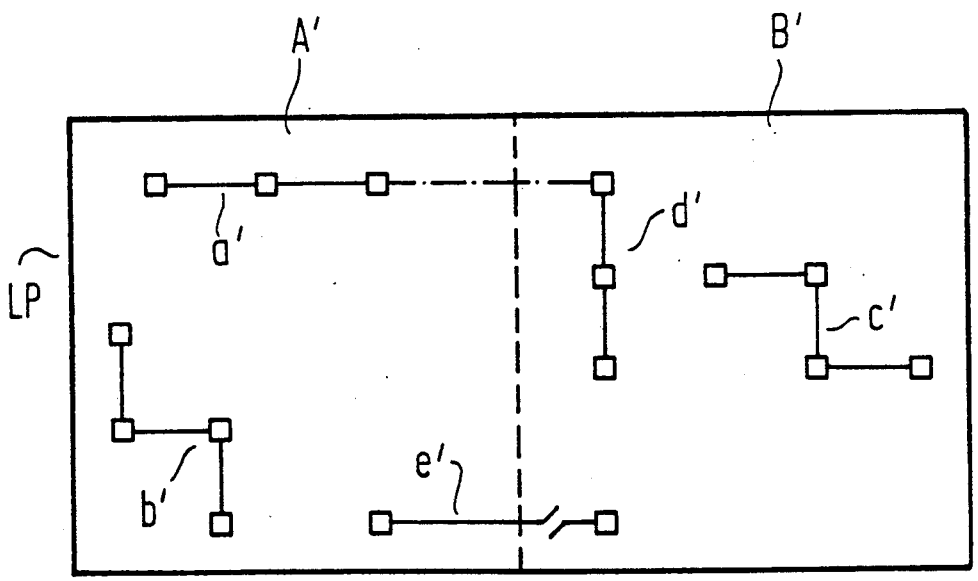
FIG. 2 is a schematic representation of a plan view of a printed circuit board having a plurality of networks composed of contact points and interconnects.

The test of the printed circuit board LP undertaken in this manner allows shorts and opens in the networks within the individual regions A-F to be detected. Shorts between networks of different regions (for example in the networks a and d) as well as opens between contact points of networks that extend beyond regions (for example, in the networks e or f), however, cannot yet be therewith detected. This requires a further test cycle in which the networks of a region (for example the region A) are respectively tested with reference to all other regions B-F. For explaining this test cycle, let it be assumed below that the scanning field of the electron beam measuring instrument employed requires a subdivision of the printed circuit board into only two regions A' and B' (see FIG. 2). The contact points of the networks A', B' and C' should thereby lie only within one of the regions A' or B'. Further, a conductive connection (short) to the network a' is assumed to exist in the network d' (shown with a broken line in FIG. 2) and an open is assumed to be present in the network e'.

The test cycle can then be described in the following manner:
- implementation of the test within the regions A' and B', each respectively as set forth above;
- discharging the printed circuit board;
- positioning the region A' in the scanning field of the electron beam measuring instrument;
- charging all contact points lying in the region A';
- positioning the region B' in the scanning field of the electron beam measuring instrument;
- scanning the charge state of the points lying in the region B' with the electron probe by detecting the respective triggered secondary electrons; and
- comparison of the respective measured charge states with the charge states anticipated on the basis of the network geometry.

After implementation of the measurement, one can therefore immediately determine that the contact point of the network e' lying the region B' is not charged. An open must consequently be present in this network.

The connection (short) of the network d' to the network a' is expressed in that the network d' is charged.

Corresponding test steps are to be implemented when testing printed circuit boards that must be divided into more than two regions due to the limited scanning field of the electron beam measuring instrument. The charging or, respectively, discharging of the contact points lying outside of the scanning field are thereby preferably undertaken with a large-area electron beam, ion beam or photon beam, so that each region has to be brought into congruency with the scanning field only once. A mechanical displacement of the printed circuit board or, respectively, of the electron optics can be avoided when an electron beam system is assigned to each of the regions.

In accordance with further aspects and features of the invention, shorts in networks of different regions, as well as opens between contact points of networks extending beyond regions can be detected after implementing the following steps:
- charging all contact points of the printed circuit board;
- discharging the contact points lying in the region B';
- positioning the region A' in the scanning field of an electron beam measuring instrument; and
- scanning the charge states of the contact points lying in the region A' with the electron probe.

The comparison of the measured charge states with the charge states respectively anticipated on the basis of the network geometry here likewise leads to the result that the network a' and d' are conductively connected (with the discharge of the contact points of the network d' lying the region B', the network a' also discharges due to the existing short). With reference to the charge state of the contact point of the network e' lying in the region A', one can also recognize that an open must be present therein.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A method for testing a printed circuit board which comprises a plurality of networks composed of contact points and interconnects, comprising the steps of:
   (a) dividing the printed circuit board into a plurality of adjoining regions;
   (b) charging all contact points lying within a selected first region;
   (c) measuring the charge states of the contact points of a selected second region by
      (c1) scanning the contact points of the selected second region with a particle probe;
   (d) comparing the measured charge states with reference charge states which are anticipated on the basis of network geometry;
   (e) repeating the steps (b) through (d) for each of the other regions such that during each repetition a different region is the selected first region; and
   (f) before each repetition of the step (b), discharging the networks of the printed circuit board.

2. The method of claim 1, wherein the particle probe has a scan field of a predetermined size, and the step (a) is further defined as:
   (a1) dividing the printed circuit board into a plurality of regions each of which is approximately the same size as said predetermined size of said scan field.

3. The method of claim 1, wherein the step (b) is further defined as:

(b1) charging contact points which lie outside of the selected region by irradiating those contact points with a particle probe.

4. The method of claim 1 wherein the steps (b) and (f) are respectively further defined as:
(b1) and (f1) charging and discharging the contact points with a particle probe.

5. A method for testing a printed circuit board with a particle probe, the printed circuit board comprising a plurality of networks composed of contact points and interconnects, comprising the steps of:
(a) dividing the printed circuit board into a plurality of adjoining regions;
(b) charging all contact points of the networks;
(c) discharging all of the contact points lying within a selected first region;
(d) measuring the charge states of the contact points lying within a selected second region;
(e) comparing the measured charge states to reference charge states which are anticipated on the basis of network geometry; and
(f) repeating the steps (b) through (e) for each of the other regions such that during each repetition a different region is the selected first region.

6. The method of claim 5, wherein the particle probe has a scan field of a predetermined size, and the step (a) is further defined as:
(a1) dividing the printed circuit board into a plurality of regions each of which is approximately the same size as said predetermined size of said scan field.

7. The method of claim 5, wherein the step (b) is further defined as:
(b1) charging the contact points of the networks of the printed circuit board by irradiating the contact points with a particle probe.

8. The method of claim 5, wherein the steps (b) and (c) are each further defined as:
(b1) and (c1) planarly irradiating the respective contact points with a particle beam.

9. A method for testing a printed circuit board which comprises a plurality of networks composed of contact points and interconnects, comprising the steps of:
(a) dividing the printed circuit board into a plurality of adjoining regions of equal predetermined size;
(b) charging all contact points lying within a selected first region;
(c) measuring the charge states of the contact points of a selected second region by
(c1) scanning the contact points of the selected second region with a particle probe having a scan field of said predetermined size while causing relative displacement between the printed circuit board and the scan field to effect congruency between the scan field and the selected second region, and
(c2) scanning the selected second region with the particle probe and detecting the charge states of the contact points;
(d) comparing the measured charge states with reference charge states which are anticipated on the basis of network geometry;
(e) repeating the steps (b) through (d) for each of the other regions such that during each repetition a different region is the selected first region; and
(f) before each repetition of the step (b), discharging the networks of the printed circuit board.

10. The method of claim 9, wherein the substep (c1) of causing relative displacement is further defined as:
(c1a) displacing the printed circuit board with respect to the scan field.

11. The method of claim 9, wherein the substep (c1) of causing relative displacement is further defined a:
(c1a) displacing the scan field with respect to the printed circuit board.

* * * * *